(12) United States Patent
Kim et al.

(10) Patent No.: US 6,421,278 B1
(45) Date of Patent: Jul. 16, 2002

(54) METHOD OF IMPROVING AN ELECTROSTATIC DISCHARGE CHARACTERISTIC IN A FLASH MEMORY DEVICE

(75) Inventors: Jong Woo Kim, Seoul; Tae Kyu Kim, Kyungki-Do, both of (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/722,353

(22) Filed: Nov. 28, 2000

(30) Foreign Application Priority Data

Dec. 28, 1999 (KR) .............................................. 99-63895

(51) Int. Cl.$^7$ .............................................. G11C 16/33
(52) U.S. Cl. .................................. 365/185.33; 365/226
(58) Field of Search ........................... 365/185.33, 226, 365/185.04, 185.05, 63, 185.25

(56) References Cited

U.S. PATENT DOCUMENTS

| | | | | |
|---|---|---|---|---|
| 5,517,444 A | * | 5/1996 | Ishimura ...................... | 365/226 |
| 5,657,284 A | * | 8/1997 | Beffa .......................... | 365/226 |
| 5,724,297 A | * | 3/1998 | Noda et al. .................. | 365/226 |
| 5,744,842 A | * | 4/1998 | Ker ............................. | 257/362 |
| 5,835,395 A | * | 11/1998 | Schreck et al. .............. | 365/51 |
| 5,893,233 A | * | 4/1999 | Yee ............................. | 438/238 |
| 5,930,170 A | * | 7/1999 | Kunst et al. ............. | 365/185.18 |

* cited by examiner

Primary Examiner—Tan T. Nguyen
(74) Attorney, Agent, or Firm—Finnegan, Henderson, Farabow, Garrett & Dunner, L.L.P.

(57) ABSTRACT

There is disclosed a method of improving an electrostatic discharge ("ESD") characteristic in a flash memory device. In order to prevent generation of leak current caused when charges generated upon a testing of the ESD are introduced into an internal circuit, the prevent can prevent a current fail in the internal circuit, by connecting a drain junction power supply terminal and a ground terminal line, in the connection of an internal circuit and a SDA input buffer in a flash memory device, to connection terminals spaced apart to each other.

4 Claims, 2 Drawing Sheets

METHOD OF IMPROVING AN ELECTROSTATIC DISCHARGE CHARACTERISTIC IN A FLASH MEMORY DEVICE

CROSS-REFERENCE TO RELATED APPLICATION

Priority is claimed from Republic of Korean Patent Application No. 99-63895 filed Dec. 28, 1999, which is incorporated in its entirety by reference.

BACKGROUND OF THE INVENTION

1. Field of the Invention

The invention relates generally to a method of improving an electrostatic discharge (hereinafter called "ESD") characteristic in a flash memory device. More particularly, the present invention relates to, a method of improving an ESD characteristic in a flash memory device which can prevent generation of leak current, that is caused when charges generated upon testing of the ESD are introduced into an internal circuit.

2. Description of the Prior Art

In general, the test method of measuring an ESD level involves a Human Body Model ("HBM") of a high voltage/low current model and a Machine Model of a low voltage/high current model. Upon measurement of the ESD level, as electric field paths can be formed from the input pin toward the power supply terminal Vcc and from the input pin toward the ground terminal Vss, both the Vcc basis and the Vss basis must be tested. Also, as it may vary depending on a field direction, when it is the Vcc basis (or Vss basis), the Vcc is grounded and the positive voltage and the negative voltage are applied to the corresponding pins, respectively, three times.

Then, during the Human Body Model Vcc negative zapping, a current fail (Isb fail) is generated by the leak current $I^{1kg}$ in the data output (DQ) pin. At this time, the cause of generation of the current fail (Isb fail) will be below explained by reference to FIGS. 1 and 2.

FIGS. 1 and 2 are diagrams for explaining generation of fail in an internal circuit upon a conventional testing of an electrostatic discharge.

In a standby state, a power supply voltage is directly applied to the NMOS drain junction of an internal circuit 15 and a SDA input buffer through a Vcc pad 12. Also, a neighboring NMOS source junction is connected to the ground terminal via a Vss pad 13. In this state, if charges are discharged through the Vcc supply line by the ESD stress, the charges are introduced into the internal circuit 15, thus connecting the Vcc and the Vss on the border of a field oxide film in most of the internal circuit. Then, damage is generated at a weaken portion in the circuit and current fail 15, A is therefore generated.

That is, conventionally, there is a problem that the ESD characteristic is degraded such as generation of current fail, etc. because the Vcc line and the Vss line are neighboring to each other by a distance D (2.7 $\mu$m) on the border of the field oxide film at the connection of the internal circuit and the SDA input buffer.

SUMMARY OF THE INVENTION

It is therefore an object of the present invention to provide a method of improving an electrostatic discharge characteristic in a flash memory device capable of preventing current fail in the internal circuit, by not neighboring a Vss line and a Vcc line to each other in the connection of the internal circuit and a SDA input buffer.

In order to accomplish the above object, a method of improving an electrostatic discharge characteristic in a flash memory device according to the present invention is characterized in that it comprises the step of connecting a drain junction power supply terminal and a ground terminal line, in the connection of an internal circuit and a SDA input buffer in a flash memory device, to connection terminals spaced apart to each other.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
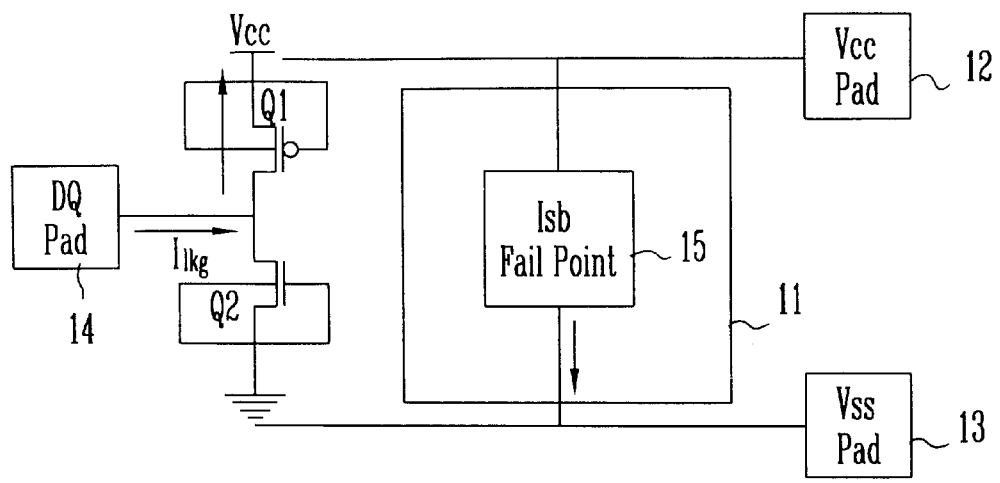
FIGS. 1 and 2 are diagrams for explaining generation of fail in an internal circuit upon a conventional testing of an electrostatic discharge.
Figure 2:
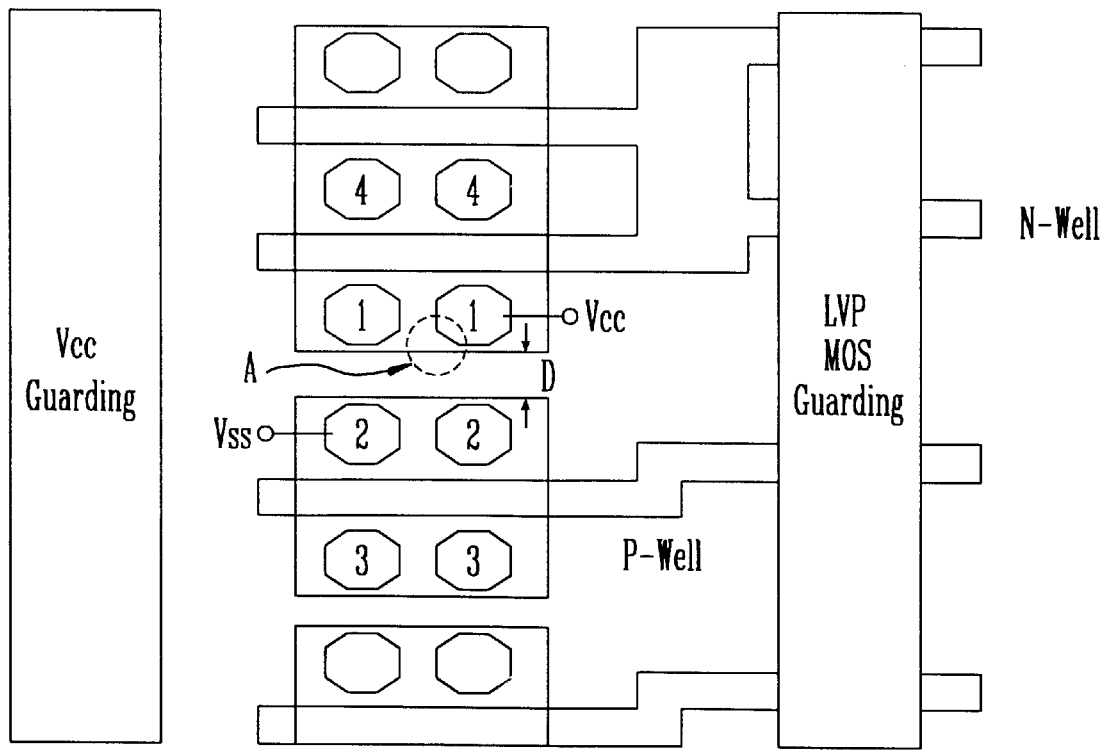

The present invention will be described in detail by way of a preferred embodiment with reference to accompanying drawings, in which like reference numerals are used to identify the same or similar parts.

Figure 3:
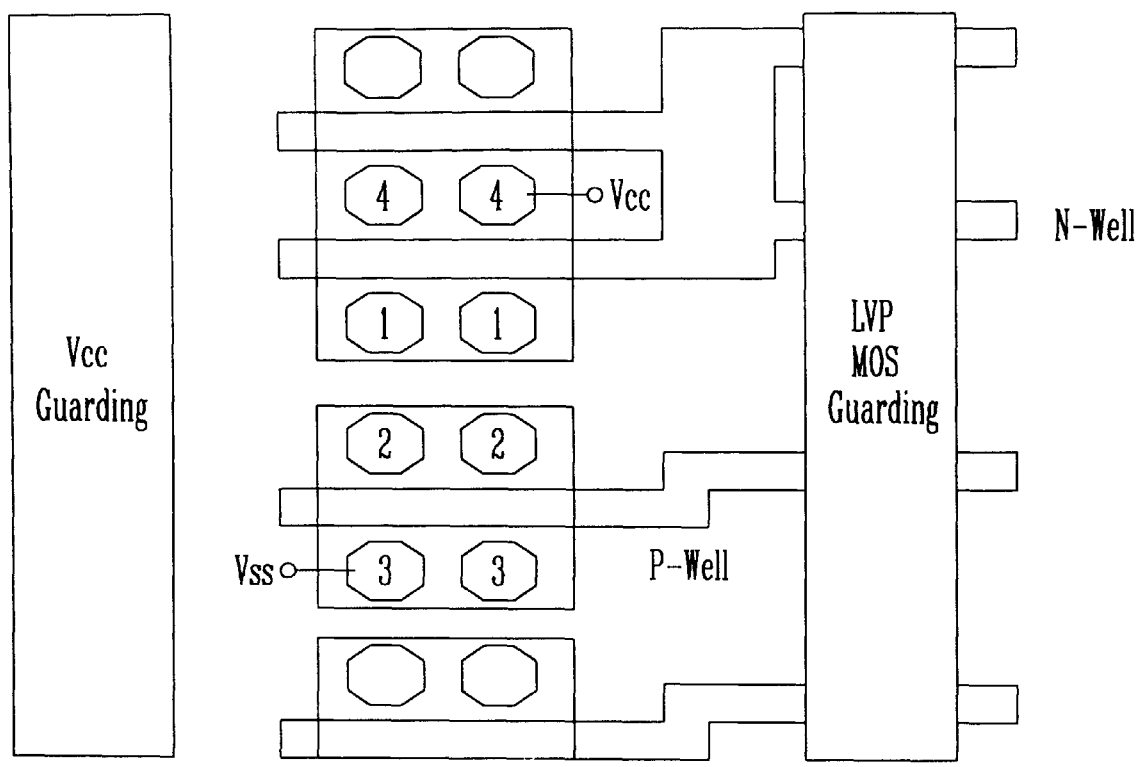
FIG. 3 is a diagram showing the connection of an internal circuit and a SDA input buffer, for explaining a method of improving an electrostatic discharge characteristic in a flash memory device according to the present invention.

FIG. 3 is a diagram showing the connection of an internal circuit and a SDA input buffer, for explaining a method of improving an electrostatic discharge characteristic in a flash memory device according to the present invention.

As shown, the present invention changes the layout so that a Vss line and a Vcc line are not neighboring to each other in the connection of the internal circuit and the SDA input buffer.

Table 1 compares the condition on which voltages are applied at respective terminals in the connection of the internal circuit and the SDA input buffer.

TABLE 1

| | Number of connection terminal | 1 | 2 | 3 | 4 | 5 | 6 |
|---|---|---|---|---|---|---|---|
| Internal circuit | Conventional method | Vcc | Vss | Floating | Floating | Vss | Floating |
| | Method of the present invention | Floating | Floating | Vss | Vcc | Floating | Vss |

TABLE 1-continued

| Number of connection terminal | | 1 | 2 | 3 | 4 | 5 | 6 |
|---|---|---|---|---|---|---|---|
| SDA input buffer | Conventional method | Vcc | Vss | Floating | Floating | — | — |
| | Method of the present invention | Floating | Floating | Vss | | Vcc | |

As can be seen from Table 1, conventionally, the neighboring metal contacts (No. 1 and No. 2) are used as the Vcc line and the Vss line, respectively. However, in the present invention, the metal contacts (No. 3 and No. 4) are used as the Vcc line and the Vss line, respectively. Thus, the present invention can prevent a current fail phenomenon depending on damage generating at weaken portions in the circuit.

As mentioned above, the present invention has outstanding effects that it can improve the ESD characteristic because it can prevent generation of a current fail in an internal circuit after a ESD test and can also prevent a fail depending on stress because a ESD protection circuit can be operated safely at a high power supply voltage.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of improving an electrostatic discharge characteristic in a flash memory device, comprising:
   connecting an internal circuit and a SDA input buffer to a drain junction power supply terminal and a ground terminal in the flash memory device, said connecting comprising connecting a drain junction power supply terminal and a ground terminal line to respective connection terminals spaced apart form each other;
   wherein the respective connection terminals are spaced apart a distance of at least 2.7 μm.

2. A method of improving electrostatic discharge characteristics for a connection of an internal circuit and an input buffer to a drain junction power supply terminal and a ground terminal in a flash memory device containing a plurality of connection terminals, comprising:
   connecting a drain junction power supply terminal line to a first terminal of the plurality of connection terminals; and
   connecting a ground terminal line to a second terminal of the plurality of connection terminals;
   wherein the first and second terminals are spaced apart from each other a distance of at least 2.7 μm.

3. The method according to claim 2, wherein the first and second terminals are spaced apart such that at least one other terminal of the plurality of connection terminals is disposed between the first and second terminals.

4. A flash memory device with improved electrostatic discharge characteristics, comprising:
   an internal circuit;
   an input buffer;
   a first connection terminal coupled to the internal circuit and input buffer;
   a second connection terminal spaced apart from the first connection terminal and coupled to the internal circuit and input buffer;
   a drain junction power supply line coupled to the first connection terminal; and
   a ground terminal line coupled to the second connection terminal;
   wherein the first and second terminals are spaced apart from each other a distance of at least 2.7 μm.

* * * * *